United States Patent
Loo

(10) Patent No.: US 8,338,943 B2
(45) Date of Patent: Dec. 25, 2012

(54) SEMICONDUCTOR PACKAGE WITH THERMAL HEAT SPREADER

(75) Inventor: Kum Weng Loo, Singapore (SG)

(73) Assignee: STMicroelectronics Asia Pacific Pte Ltd., Singapore (SG)

(*) Notice: Subject to any disclaimer, the term of this patent is extended or adjusted under 35 U.S.C. 154(b) by 120 days.

(21) Appl. No.: 12/873,068

(22) Filed: Aug. 31, 2010

(65) Prior Publication Data
US 2012/0050996 A1 Mar. 1, 2012

(51) Int. Cl.
*H01L 23/10* (2006.01)
*H01L 23/34* (2006.01)

(52) U.S. Cl. .. 257/707; 257/713; 257/778; 257/E23.101

(58) Field of Classification Search .................. 257/707, 257/713, 778, E23.101
See application file for complete search history.

(56) References Cited

U.S. PATENT DOCUMENTS

| | | | | |
|---|---|---|---|---|
| 5,909,056 A | * | 6/1999 | Mertol | 257/704 |
| 5,952,719 A | * | 9/1999 | Robinson et al. | 257/737 |
| 6,084,297 A | * | 7/2000 | Brooks et al. | 257/698 |
| 6,133,064 A | * | 10/2000 | Nagarajan et al. | 438/106 |
| 6,369,443 B1 | * | 4/2002 | Baba | 257/700 |
| 6,369,455 B1 | * | 4/2002 | Ho et al. | 257/796 |
| 6,580,167 B1 | * | 6/2003 | Glenn et al. | 257/718 |
| 6,903,271 B2 | * | 6/2005 | Pearson et al. | 174/548 |
| 7,061,102 B2 | * | 6/2006 | Eghan et al. | 257/713 |
| 7,663,227 B2 | * | 2/2010 | Macris et al. | 257/706 |
| 2002/0113306 A1 | * | 8/2002 | Kwon et al. | 257/691 |

* cited by examiner

*Primary Examiner* — Nitin Parekh
(74) *Attorney, Agent, or Firm* — Seed IP Law Group PLLC

(57) ABSTRACT

A semiconductor package includes a substrate, a stiffener ring coupled to the substrate and configured to form a well with the substrate, and a die positioned in the well. A thermal interface is positioned on the die. A heat spreader is coupled to the stiffener ring so that a portion of the heat spreader is positioned in the well and the thermal interface thermally couples the heat spreader to the die. The portion of the heat spreader positioned in the well adds rigidity to the semiconductor package and facilitates the use of thin dies.

26 Claims, 11 Drawing Sheets

SEMICONDUCTOR PACKAGE WITH THERMAL HEAT SPREADER

BACKGROUND

1. Technical Field

This disclosure relates to semiconductor packages and more particularly to semiconductor packages with heat spreaders.

2. Description of the Related Art

Semiconductor packages, such as flip-chip ball grid array (BGA) packages, may include stiffener elements to strengthen the package and heat spreaders to provide thermal protection. A typical semiconductor package 100 and a method for assembling the package are illustrated in FIGS. 1-6. As shown in FIGS. 1 and 2, a semiconductor package 100 has a substrate 102, such as an organic substrate, for example, a printed circuit board, and a die 104 coupled to the substrate 102. The die 104 may be coupled to the substrate 102 using, for example, an under fill adhesive 106. FIG. 1 is a side cross-sectional view of the die 104 mounted on the substrate 102 and FIG. 2 is a top view of the package 100 of FIG. 1.

As shown in FIGS. 3 and 4, a stiffener ring 108 is then coupled to the substrate 102 surrounding the die 104. An adhesive layer 110 may be used, for example, to mount the stiffener ring 108 to the substrate 102. FIG. 3 is a side cross-sectional view of the package 100 with the die 104 and stiffener ring 108 mounted on the substrate 102, and FIG. 4 is a top view of the package 100 of FIG. 3.

As shown in FIGS. 5 and 6, a heat spreader 112 is then coupled to the die 104 and the stiffener ring 108. One or more adhesive layers 114 may be used, for example, to mount the heat spreader 112 to the stiffener ring 108. A thermal interface material 116 may be inserted between the die 102 and the heat spreader 112. FIG. 5 is a side cross-sectional view of the package 100 with the heat spreader 112 mounted on the stiffener ring 108, and FIG. 6 is a top view of the package 100 of FIG. 5. Of course, the order in which the substrate 102, die 104, stiffener ring 108 and heat spreader 112 are coupled to each other may be modified. Typically, however, the order is as shown in FIGS. 1 to 6.

BRIEF SUMMARY

In an embodiment, a semiconductor package includes a substrate, a stiffener ring coupled to the substrate and configured to form a well with the substrate, and a die positioned in the well. A thermal interface is positioned on the die. A heat spreader is coupled to the stiffener ring so that a portion of the heat spreader is positioned in the well and the thermal interface thermally couples the heat spreader to the die. The portion of the heat spreader positioned in the well adds rigidity to the semiconductor package and facilitates the use of thin dies. A portion of the heat spreader acts as a lid for the semiconductor package.

In an embodiment, a semiconductor package comprises: a substrate having a first surface; a stiffener having a bottom and an inner surface, wherein the bottom of the stiffener is coupled to the first surface of the substrate and the inner surface of the stiffener and the first surface of the substrate are configured to form a well; a semiconductor die positioned in the well and coupled to the first surface of the substrate; and a heat spreader coupled to the stiffener and at least partially positioned in the well. In an embodiment, the stiffener comprises a rectilinear ring. In an embodiment, the heat spreader comprises: a top portion coupled to the stiffener; and a bottom portion extending from the top portion of the heat spreader into the well. In an embodiment, the top portion of the heat spreader is substantially slab-shaped. In an embodiment, the bottom portion of the heat spreader comprises a substantially slab-shaped region having a perimeter smaller than a perimeter of the top portion of the heat spreader. In an embodiment, the package further comprises a thermal interface thermally coupling the die to the bottom portion of the heat spreader. In an embodiment, the bottom portion of the heat spreader further comprises a rectilinear ring extending from the slab-shaped region of the bottom portion of the heat spreader. In an embodiment, the rectilinear ring of the bottom portion of the heat spreader is coupled to the first surface of the substrate. In an embodiment, the bottom portion of the heat spreader further comprises a plurality of legs extending from the top portion of the heat spreader into the well. In an embodiment, the plurality of legs are coupled to the first surface of the substrate. In an embodiment, the bottom portion of the heat spreader is coupled to the inner surface of the stiffener. In an embodiment, the die is thinner than the stiffener. In an embodiment, the heat spreader comprises a single piece of thermally conductive material. In an embodiment, the heat spreader comprises one or more metallic pieces. In an embodiment, the heat spreader comprises one or more ceramic pieces. In an embodiment, the heat spreader is formed from a plurality of pieces of thermally conductive material. In an embodiment, the plurality of pieces comprises a first piece formed from a first thermally conductive material and second piece formed from a second thermally conductive material.

In an embodiment, a system comprises: a semiconductor package, including: a substrate having a first surface; a stiffener having a bottom and an inner surface, wherein the bottom of the stiffener is coupled to the first surface of the substrate and the inner surface of the stiffener and the first surface of the substrate are configured to form a well; a semiconductor die positioned in the well and coupled to the first surface of the substrate; a heat spreader coupled to the stiffener and at least partially positioned in the well; and a thermal interface thermally coupling the die to the bottom portion of the heat spreader; and a circuit board communicatively coupled to the semiconductor package. In an embodiment, the stiffener comprises a rectilinear ring. In an embodiment, the heat spreader comprises: a top portion coupled to the stiffener; and a bottom portion extending from the top portion of the heat spreader into the well. In an embodiment, the top portion of the heat spreader is substantially slab-shaped. In an embodiment, the bottom portion of the heat spreader comprises a substantially slab-shaped region having a perimeter smaller than a perimeter of the top portion of the heat spreader. In an embodiment, the bottom portion of the heat spreader further comprises a rectilinear ring extending from the slab-shaped region of the bottom portion of the heat spreader. In an embodiment, the bottom portion of the heat spreader further comprises a plurality of legs extending from the top portion of the heat spreader into the well. In an embodiment, the bottom portion of the heat spreader is coupled to the inner surface of the stiffener. In an embodiment, the die is thinner than the stiffener. In an embodiment, the heat spreader is formed from a plurality of pieces of thermally conductive material.

In an embodiment, a method comprises: coupling a die to a substrate; coupling a stiffener to the substrate wherein the die is positioned in a well formed by the substrate and the stiffener; positioning a thermal interface with respect to the die; and coupling a heat spreader to the stiffener, wherein at least a portion of the heat spreader is positioned in the well and the thermal interface is positioned to thermally couple the die to the heat spreader. In an embodiment, the stiffener comprises a rectilinear ring. In an embodiment, coupling the heat spreader to the stiffener comprises adhering a top portion of the heat spreader to a top of stiffener, and a bottom portion of the heat spreader extends from the top portion of the heat spreader into the well. In an embodiment, the top portion of the heat spreader is substantially slab-shaped. In an embodiment, the bottom portion of the heat spreader comprises a substantially slab-shaped region having a perimeter smaller than a perimeter of the top portion of the heat spreader. In an embodiment, the bottom portion of the heat spreader further comprises a rectilinear ring extending from the slab-shaped region of the bottom portion of the heat spreader. In an embodiment, the bottom portion of the heat spreader further comprises a plurality of legs extending from the top portion of the heat spreader into the well. In an embodiment, coupling the heat spreader to the stiffener further comprises coupling the bottom portion of the heat spreader to an inner surface of the stiffener. In an embodiment, the die is thinner than the stiffener. In an embodiment, the method further comprises forming the heat spreader from a plurality of pieces of thermally conductive material.

In an embodiment, a semiconductor package comprises: a substrate; means for processing signals; means for coupling the means for processing signals to the substrate; means for stiffening the semiconductor package coupled to the substrate, wherein the means for processing signals is positioned in a well formed by the substrate and the means for stiffening; means for spreading heat; means for coupling the means for spreading heat to the means for stiffening, wherein at least a portion of the means for spreading heat is positioned inside the well; and means for thermally coupling the means for spreading heat to the means for processing signals. In an embodiment, the means for processing signals comprises a die; the means for coupling the means for processing signals to the substrate comprises an adhesive layer; the means for stiffening comprises a rectilinear ring; and the means for coupling the means for spreading heat to the means for stiffening comprises an adhesive layer. In an embodiment, the means for spreading heat comprises: a slab-shaped top portion configured to couple to a top of the means for stiffening; and a bottom portion configured to extend from the top portion of the means for spreading heat into the well.

DETAILED DESCRIPTION

Figure 2:
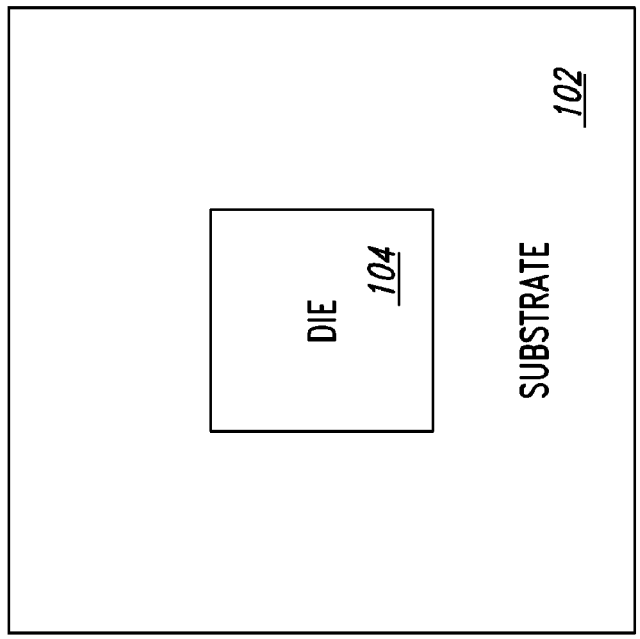
FIGS. 1 to 6 illustrate a conventional semiconductor integrated circuit package and a process of assembling a conventional semiconductor integrated circuit package.
Figure 1:
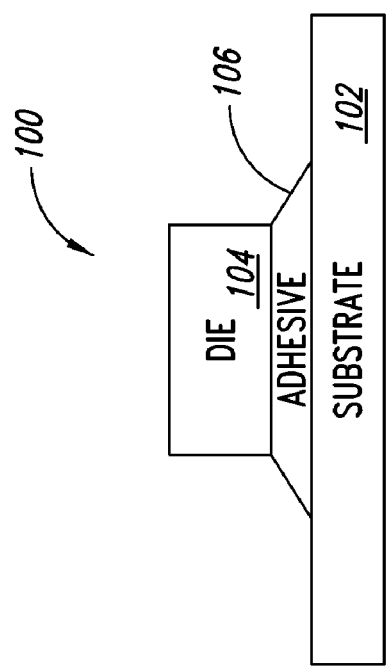
Figure 6:
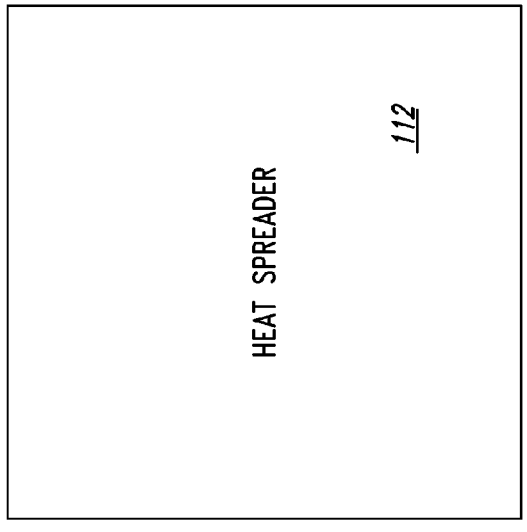
Figure 5:
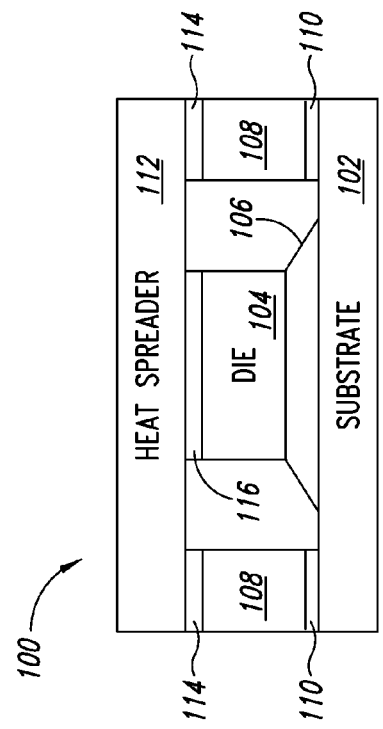
Figure 4:
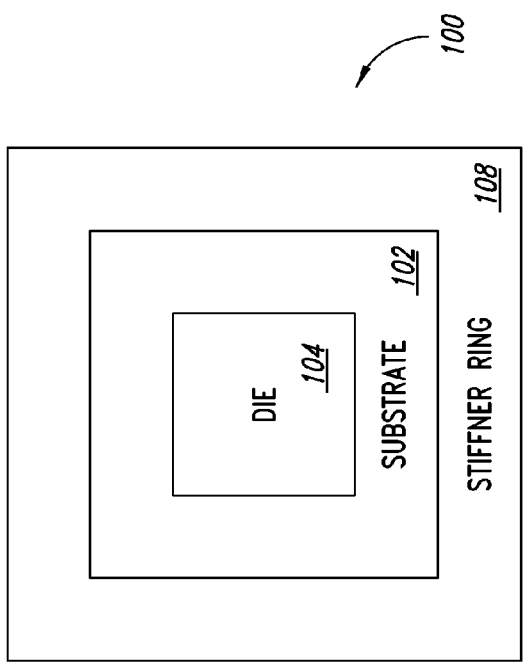
Figure 3:
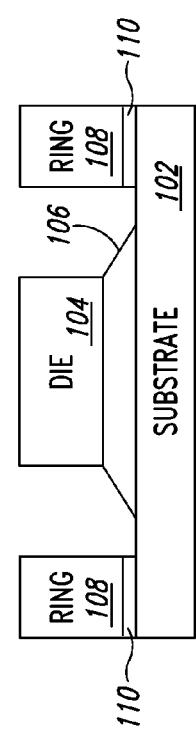

In the following description, certain details are set forth in order to provide a thorough understanding of various embodiments of devices, methods and articles. However, one of skill in the art will understand that other embodiments may be practiced without these details. In other instances, well-known structures and methods associated with, for example, bonding pads and wire bonding of packaged integrated circuits and traces of printed circuit boards, have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claimed invention.

The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not necessarily intended to convey any information regarding the actual shape of particular elements, and have been selected solely for ease of recognition in the drawings.

Figure 7:
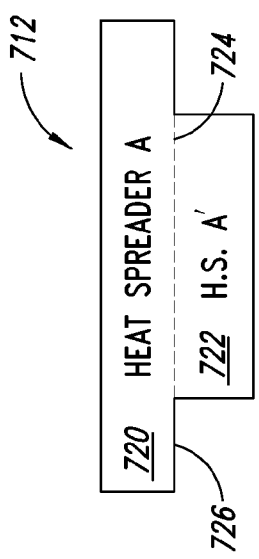
FIG. 7 illustrates an embodiment of a heat spreader.
Figure 8:
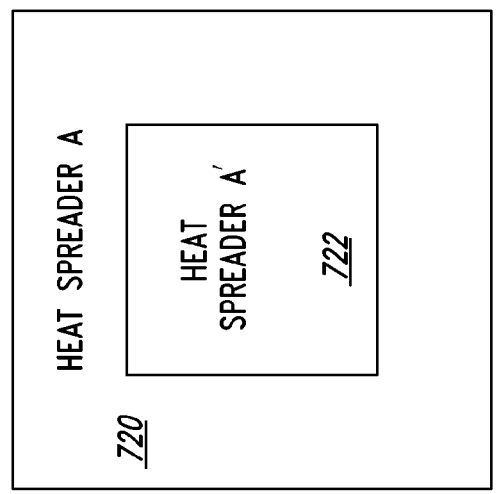
FIG. 8 is a bottom view of the embodiment of a heat spreader of FIG. 7.

FIG. 7 is a side cross-sectional view of an embodiment of a heat spreader 712. FIG. 8 is a bottom view of the heat spreader 712 of FIG. 7. The heat spreader 712 has a thicker region. As illustrated, the heat spreader 712 has a first portion 720 labeled A and a second portion 722 labeled A'. The first portion A 720 of the heat spreader 712 has a generally planar surface 726, and the second portion A' 722 of the heat spreader 712 protrudes from the generally planar surface 726 of the first portion A 720 of the heat spreader 712. The second portion A' 722 has a smaller perimeter than a perimeter of the first portion A 720 of the heat spreader 712. In FIG. 7, a plane 724 between the first portion A 720 and the second portion A' 722 of the heat spreader 712 is shown by a dashed line 724. The heat spreader 712 may be formed from a single piece of material, may be formed from two or more pieces of the same material, or may be formed from two or more pieces of different materials. For example, metallic or ceramic or combinations of metallic and ceramic materials may be used for the heat spreader 712. For example, copper and copper alloys may be used. Pieces of the heat spreader 712 may be, for example, welded together or adhered together with adhesive. As illustrated, the first portion 720 of the heat spreader 712 is a rectilinear slab and the second portion 722 of the heat spreader 712 is a rectilinear slab. Other shapes may be employed.

Figure 9:
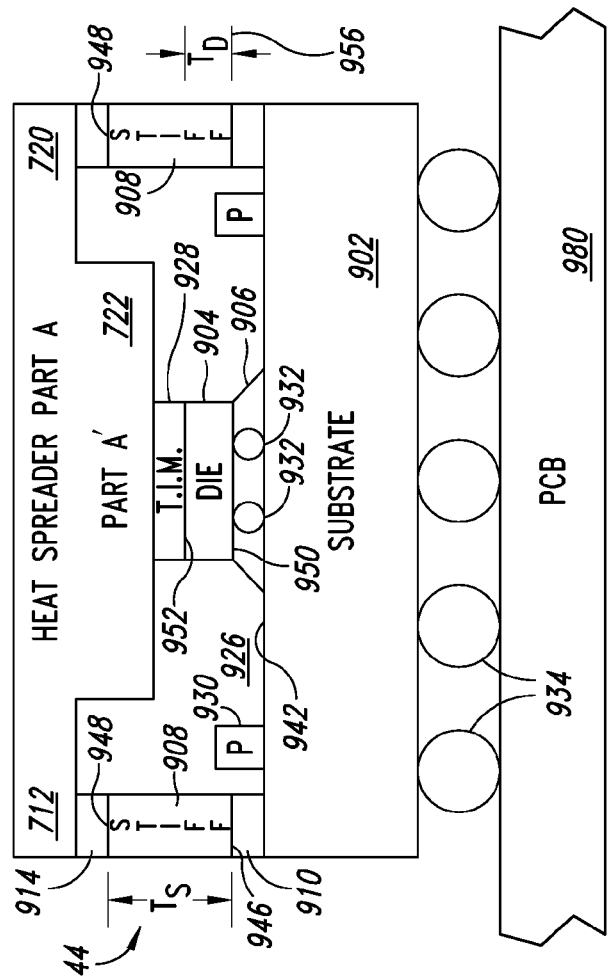
FIG. 9 illustrates an embodiment of a semiconductor package.

FIG. 9 is a side cross-sectional view a system 100 including an embodiment of a semiconductor package 900 employing the embodiment of a heat spreader 712 shown in FIGS. 7 and 8. A first surface 950 of a die 904 is adhered to a first surface 942 of a substrate 902 using an adhesive in fill layer 906. A first surface 946 of a stiffener 908 is adhered to the first surface 942 of the substrate 902 using an adhesive layer 910. The stiffener 908 has a thickness $T_S$ 944 and a second surface 948. As illustrated, the stiffener 908 is a rectilinear ring. Other shapes may be employed. The substrate 902 and the stiffener 908 substantially define a cavity or well 926, and the die is positioned inside the well 926. A second surface 952 of the die 904 is between a plane defined by the first surface 942 of the substrate 902 and a plane defined by the second surface 948 of the stiffener 908. The die 904 may have a thickness $T_D$ 956 less than the thickness $T_S$ 944 of the stiffener 908. A thermal interface material (TIM) 928 is placed on the die 904. The thermal interface 928 may be flexible to facilitate movement of the die 904 with respect to the heat spreader 712 in response to environmental stresses, such as flexing of the substrate 902. The first portion 712 of the heat spreader 712 is adhered to the stiffener 908 using an adhesive layer 914 and as illustrated is positioned above the well 926. The second portion 722 of the heat spreader 712 extends into the well 926 and is coupled to the thermal interface material 928. A portion of the heat spreader 712 extends below the plane defined by the second surface 948 of the stiffener 908. The package 900 also comprises passive devices 930 in the cavity, solder bumps 932 between the die 904 and the substrate 902. The system 100 comprises solder balls 934 on the bottom of the substrate 902 coupled to a circuit board 980, such as a printed circuit board. The solder balls 934 communicatively couple the semiconductor package 900 to the printed circuit board 980.

Figure 10:
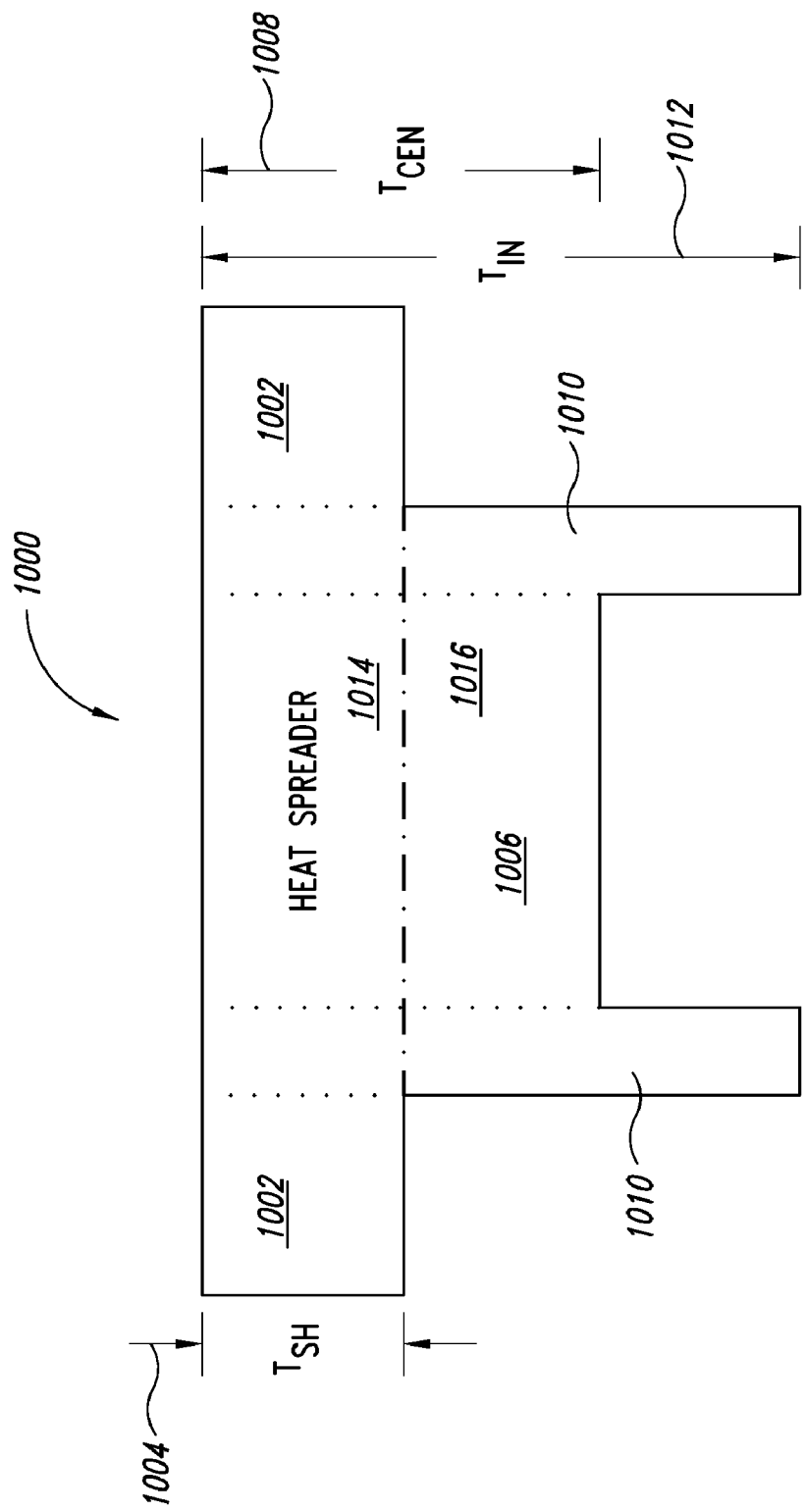
FIG. 10 illustrates an embodiment of a heat spreader.
Figure 11:
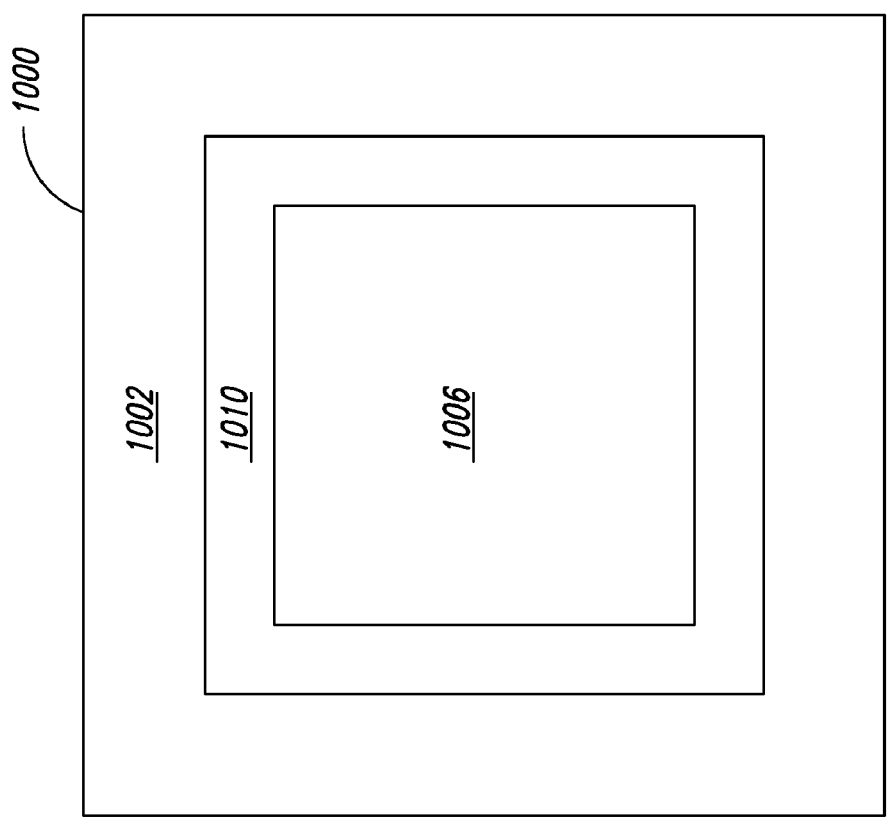
FIG. 11 is a bottom view of the embodiment of a heat spreader of FIG. 10.
Figure 12:
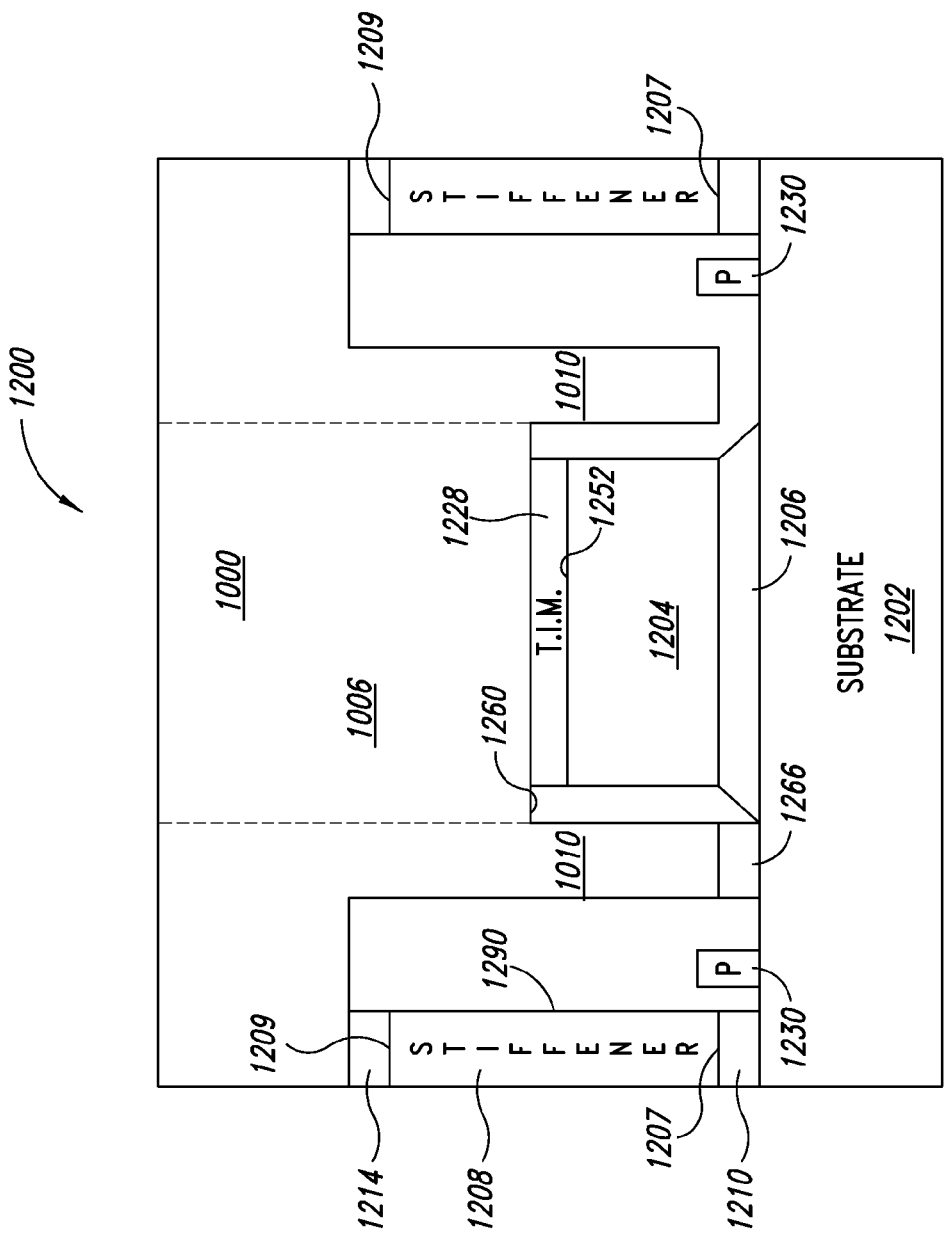
FIG. 12 illustrates an embodiment of a semiconductor package.

FIG. 10 is a front cross-section view of an embodiment of a heat spreader 1000, suitable for use, for example, in the embodiment of a package 900 of FIG. 9 or the embodiment of a package 1200 of FIG. 12. FIG. 11 is a bottom view of the heat spreader 1000 of FIG. 10. The heat spreader 1000 has a varying thickness. A shoulder region 1002 has a first thickness $T_{SH}$ 1004. A center region 1006 has a second thickness $T_{CEN}$ 1008, greater than the first thickness $T_{SH}$ 1004. An intermediate region 1010 has a third thickness $T_{IN}$ 1012 greater than the second thickness $T_{CEN}$ 1008. For purposes of illustration, the shoulder region 1002, the center region 1006 and the intermediate region 1010 as shown in FIG. 10 are separated by dotted lines. The heat spreader 1000 may be formed from a single piece of material or from a plurality of pieces and materials. For example, a top portion 1014 may be formed from a first piece of material and a second portion 1016 may be formed from a second piece of material. For purposes of illustration, the top portion 1014 and the bottom portion as shown in FIG. 10 are separated by a dashed-dotted line.

FIG. 12 illustrates an embodiment of a package 1200 employing the embodiment of a heat spreader 1000 of FIGS. 10 and 11. Some features that may commonly be present in a package are omitted from FIG. 12 for ease of illustration. The package 1200 comprises a substrate 1202, a die 1204 mounted on the substrate 1202 with an adhesive 1206, a bottom 1207 of a stiffener 1208 mounted on the substrate 1202 with an adhesive 1210, and the heat spreader 1000 adhered to a top 1209 of the stiffener 1208 with an adhesive 1214. A thermal interface material 1228 is positioned between a top 1252 of the die 1204 and a bottom 1260 of the center region 1006 of the heat spreader 1000. An intermediate region 1010 of the heat spreader 1000 extends below the top 1252 of the die 1204 toward the substrate 1202, surrounding sides of the die 1204. Optionally, the intermediate region 1010 of the heat spreader 1000 may be coupled to the substrate 1202. For example, an adhesive layer 1266 (shown on one side) may be used to couple the intermediate region 1010 of the heat spreader 1000 to the substrate 1202. Optionally, the thermal interface material 1228 may extend between the intermediate region 1010 of the heat spreader 1000 and sides of the die 1204. Optionally, an adhesive layer (not shown, see adhesive layer 1610 of FIG. 16) may adhere the intermediate region 1010 of the heat spreader 1000 to a side 1290 of the stiffener 1208, as well as to, or instead of, the top 1209 of the stiffener 1208. As shown, the package 1200 comprises passive components 1230.

Figure 13:
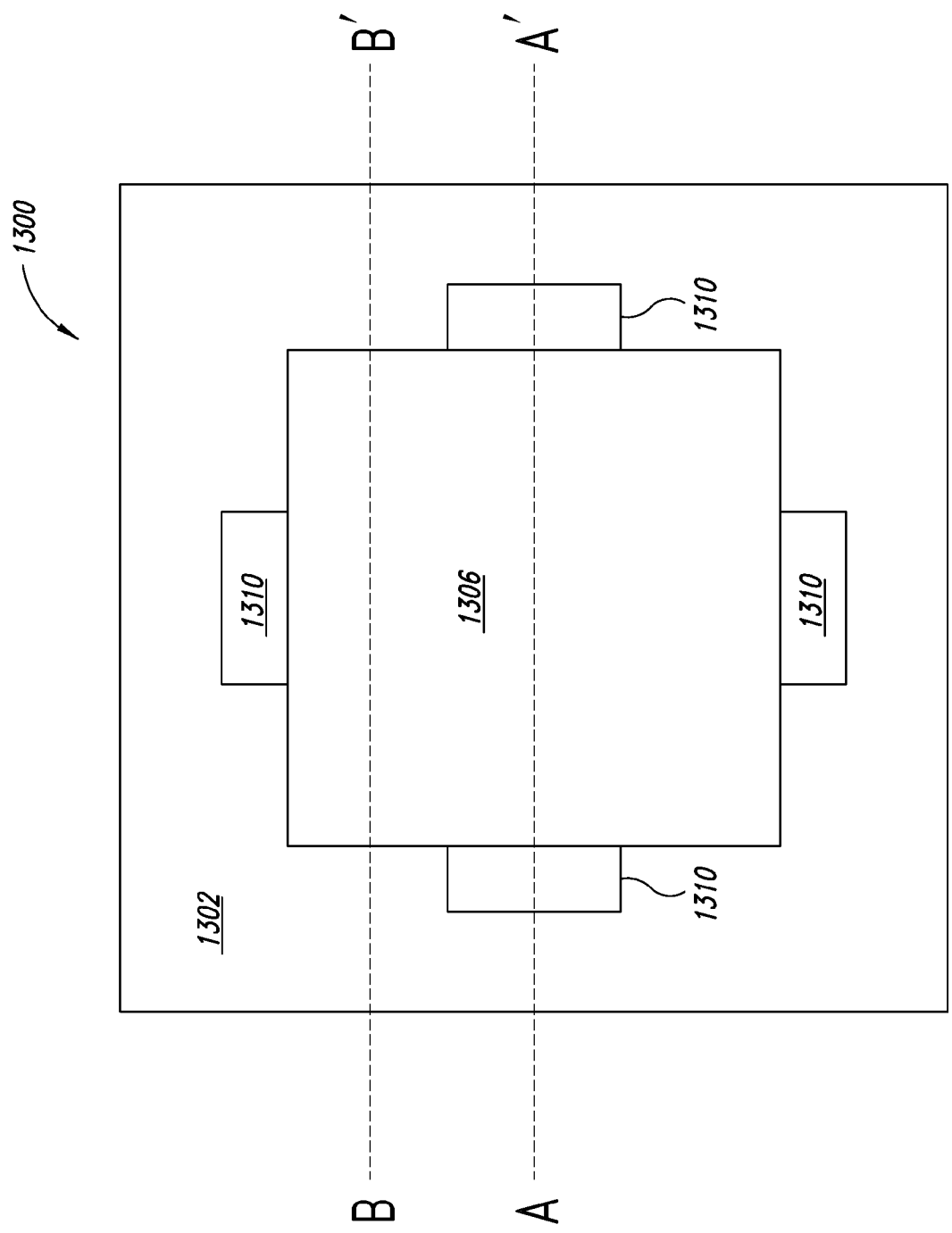
FIG. 13 illustrates an embodiment of a heat spreader.

FIG. 13 is a bottom view of an embodiment of a heat spreader 1300, suitable for use, for example, in the embodiments of packages 900, 1200 shown in FIGS. 9 and 12. The heat spreader 1300 has a shoulder region 1302 configured to couple to a stiffener (see stiffener 908 of FIG. 9 and stiffener 1208 of FIG. 12), for example, by use of an adhesive layer (see adhesive 914 of FIG. 9 and adhesive 1214 of FIG. 12), and a center region 1306 extending below the shoulder region 1302 and configured to thermally couple to a top of a die (see die 904 of FIG. 9 and the top 1252 of die 1204 of FIG. 12). For example, a thermal interface material may be used to thermally couple the heat spreader 1300 to the die. The heat spreader 1300 also comprises a plurality of legs 1310 extending adjacent to and below the center region 1306 of the heat spreader, and centered along the sides of the center region 1306. The use of legs 1310 as compared to an intermediate region (see intermediate region 1010 of FIGS. 10 and 11), may be desirable, for example, to reduce material costs, to control heat dissipation based on, for example, the shape of the legs and the materials selected, or to provide additional space for other components, such as passive components (see passive components 1230 of FIG. 12). A cross-sectional view of an embodiment of a package employing the embodiment of a heat spreader 1300 of FIG. 13, and taken along line A-A' of FIG. 13, may be similar in appearance to the cross-sectional view of an embodiment of a package 1200 shown in FIG. 12. A cross-sectional view of an embodiment of a package employing the embodiment of a heat spreader 1300 of FIG. 13, taken along line B-B' of FIG. 13, may be similar in appearance to the cross-sectional view of an embodiment of a package 900 shown in FIG. 9. The plurality of legs 1310 may vary in number and in position with respect to the center portion 1306 of the heat spreader 1310.

Figure 14:
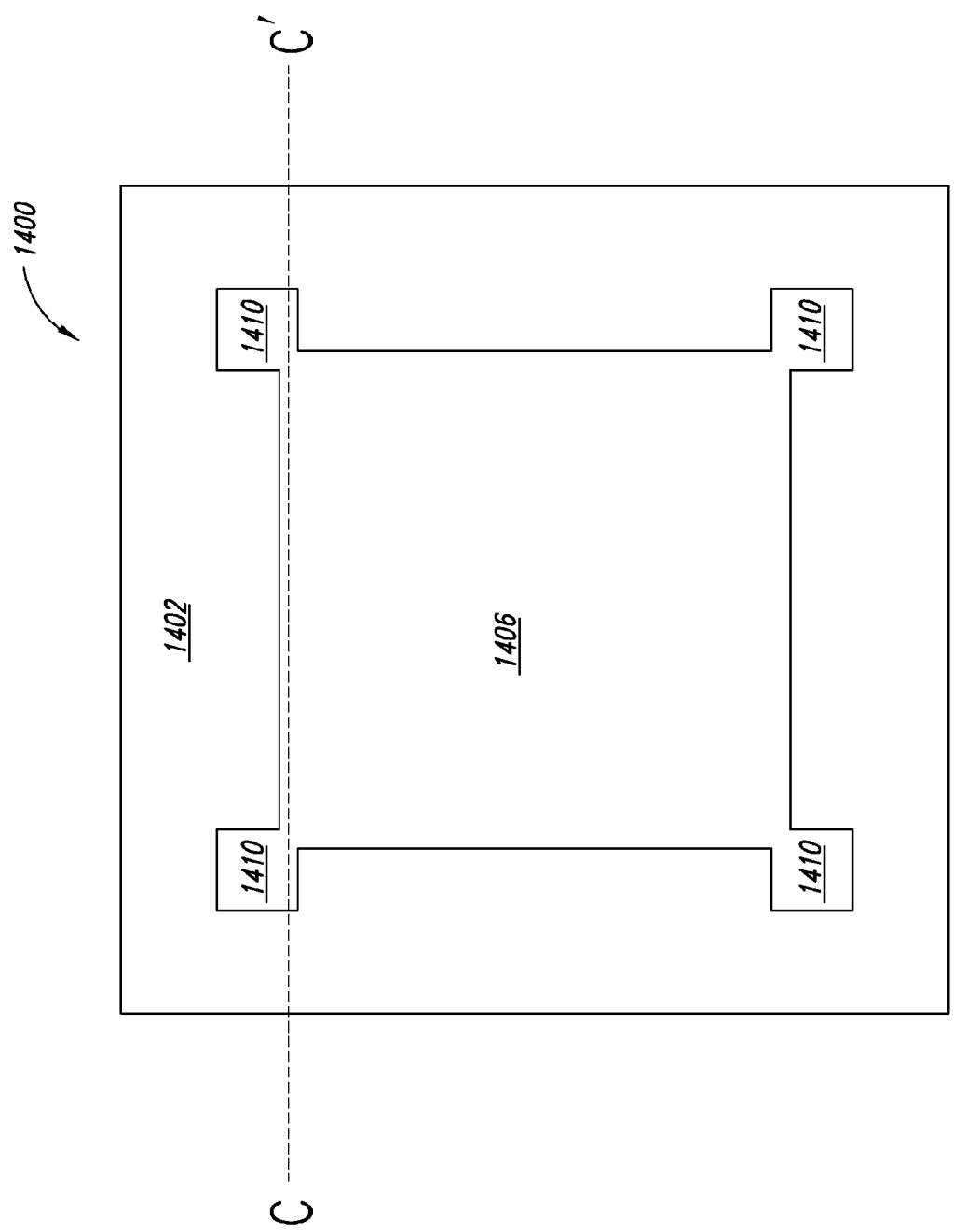
FIG. 14 illustrates an embodiment of a heat spreader.

FIG. 14 is a bottom view of an embodiment of a heat spreader 1400, suitable for use, for example, in the embodiments of packages 900, 1200 shown in FIGS. 9 and 12. The heat spreader 1400 has a shoulder region 1402 configured to couple to a stiffener (see stiffener 908 of FIG. 9 and stiffener 1208 of FIG. 12), for example, by use of an adhesive layer (see adhesive 914 of FIG. 9 and adhesive 1214 of FIG. 12), and a center region 1406 extending below the shoulder region 1402 and configured to thermally couple to a top of a die (see die 904 of FIG. 9 and the top 1252 of die 1204 of FIG. 12). For example, a thermal interface material may be used to thermally couple the heat spreader 1400 to the die. The heat spreader 1400 also comprises a plurality of legs 1410 extending adjacent to the center region 1406 of the heat spreader 1400. The use of legs 1410 as compared to an intermediate region (see intermediate region 1010 of FIGS. 10 and 11), may be desirable, for example, to reduce material costs, to control heat dissipation based on, for example, the shape of the legs and the materials selected, or to provide additional space for other components, such as passive components (see passive components 1230 of FIG. 12), or to direct heat away selected areas, such as locations of passive components. The legs 1410 as illustrated are positioned at corners of the central region 1406. The legs 1410 may be positioned in various ways with respect to the central region 1406 (see, for example, the legs 1310 of FIG. 13).

Figure 15:
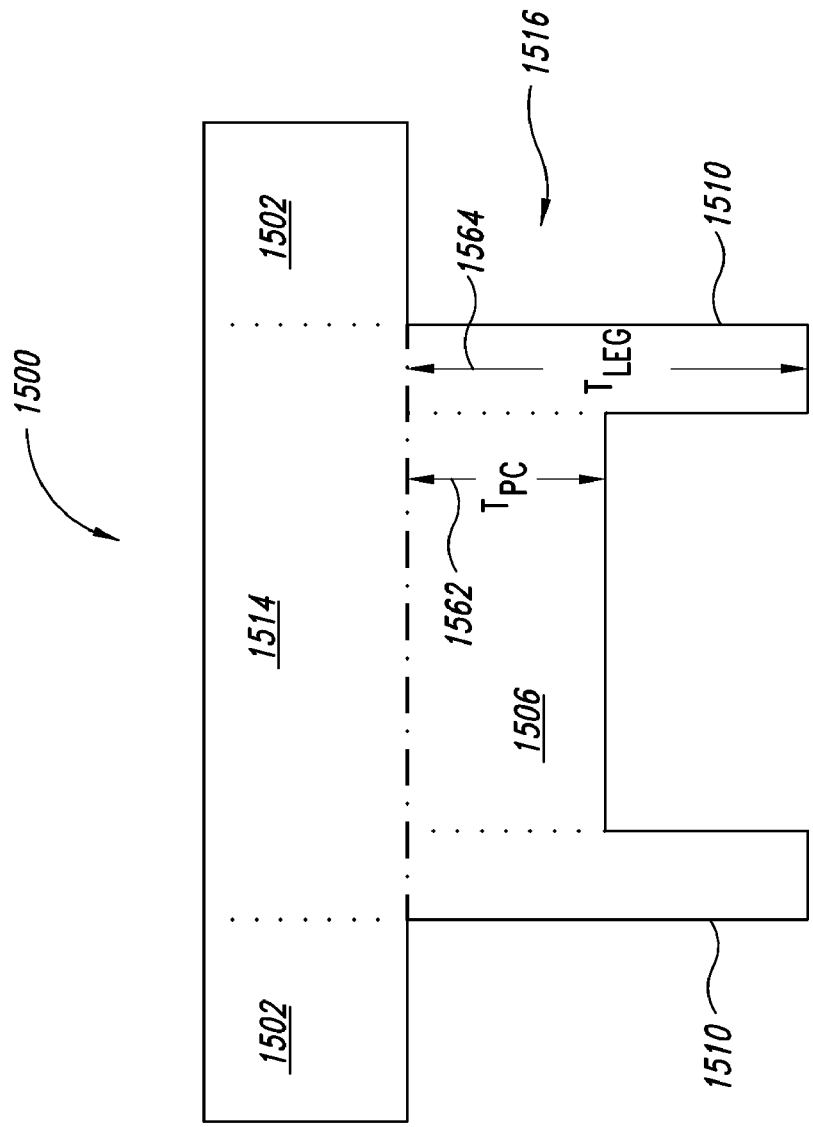
FIG. 15 illustrates an embodiment of a heat spreader.

FIG. 15 is a side cross-sectional view of an embodiment 1500 of the heat spreader 1400 of FIG. 14 taken along lines C-C' of FIG. 14. The heat spreader 1500 comprises a top portion 1514 having a shoulder region 1502. The heat spreader 1500 has a lower portion 1516 comprising a center region 1506 having a first thickness $T_{PC}$ 1562 and a plurality of legs 1510 having a thickness $T_{LEG}$ 1564. As illustrated, the legs 1510 are thicker than the center region 1506. In some embodiments, the legs 1510 and the center region 1506 may have a same thickness, or the center region 1506 may be thicker than one or more of the legs 1510. As illustrated, the legs 1510 are of a same thickness. In some embodiments the legs may have different thicknesses. Similarly, the legs of FIG. 13 may have varying lengths and may vary with respect to the thickness of the center region of the heat spreader.

Figure 16:
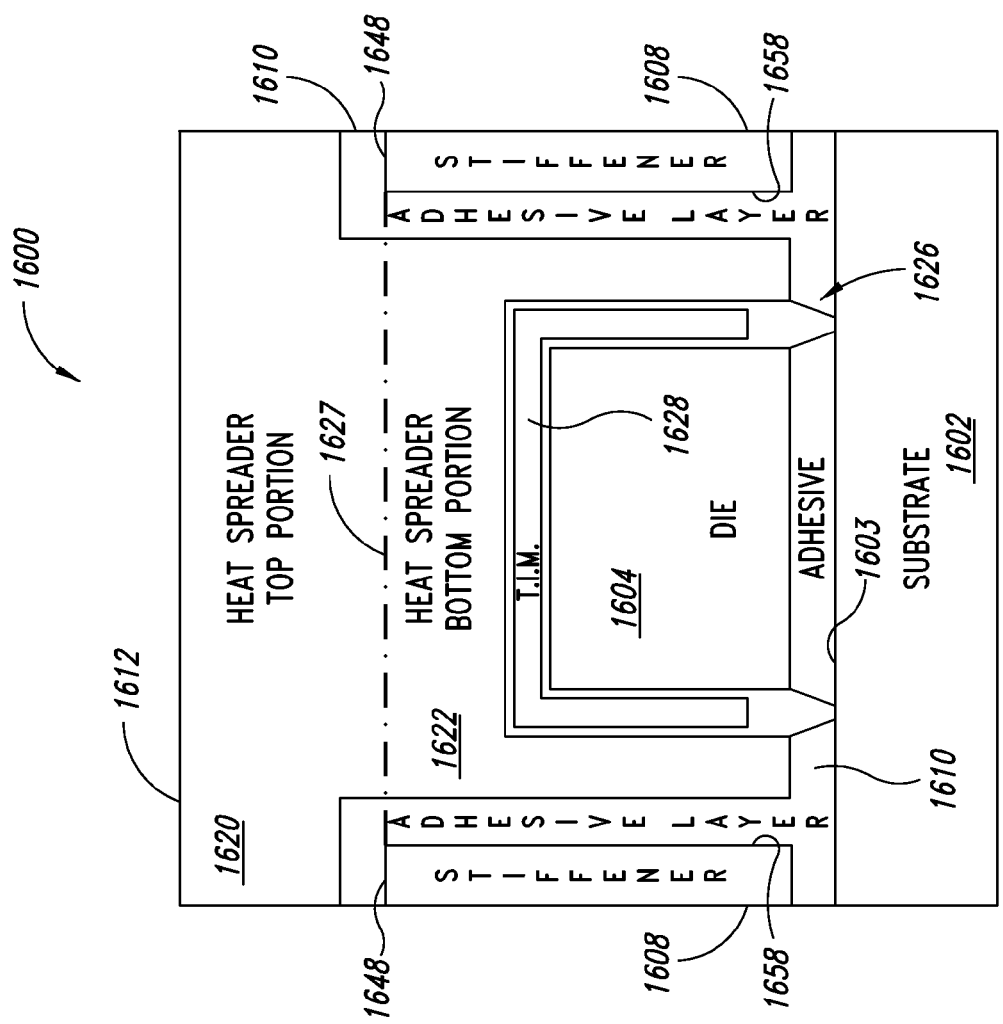
FIG. 16 illustrates an embodiment of a semiconductor package.

FIG. 16 is a side-cross sectional view of an embodiment of a semiconductor package 1600. The package 1600 comprises a substrate 1602 and a die 1604 coupled to the substrate 1602. As illustrated, the die 1604 is coupled to the substrate 1602 using an adhesive 1610. The die 1604 may be coupled to the substrate in other or additional ways. For example, solder bumps (see solder bumps 932 of FIG. 9) may couple the die 1604 to the substrate 1602 in addition to or instead of the adhesive 1610. The package 1600 comprises a stiffener 1608 and a heat spreader 1612, which as illustrated are coupled to each other and to the substrate 1602 using a continuous adhesive layer 1610. Some embodiments may employ multiple adhesive layers (see FIG. 9). A well 1626 is substantially defined by an inner surface 1658 of the stiffener 1608 and an inner surface 1603 of the substrate 1602. A top 1627 of the well 1626 is illustrated by a dashed-dotted line. The heat spreader 1612 comprises a top portion 1620 coupled to a top 1648 of the stiffener 1608, and a bottom portion 1622 of the heat spreader 1622 positioned in the well 1626. The bottom portion 1622 may be configured into various shapes. See, for example, FIGS. 7, 8, 10, 11 and 13-15. A thermal interface 1628 is configured to thermally couple the die 1604 to the heat spreader 1612.

Figure 17:
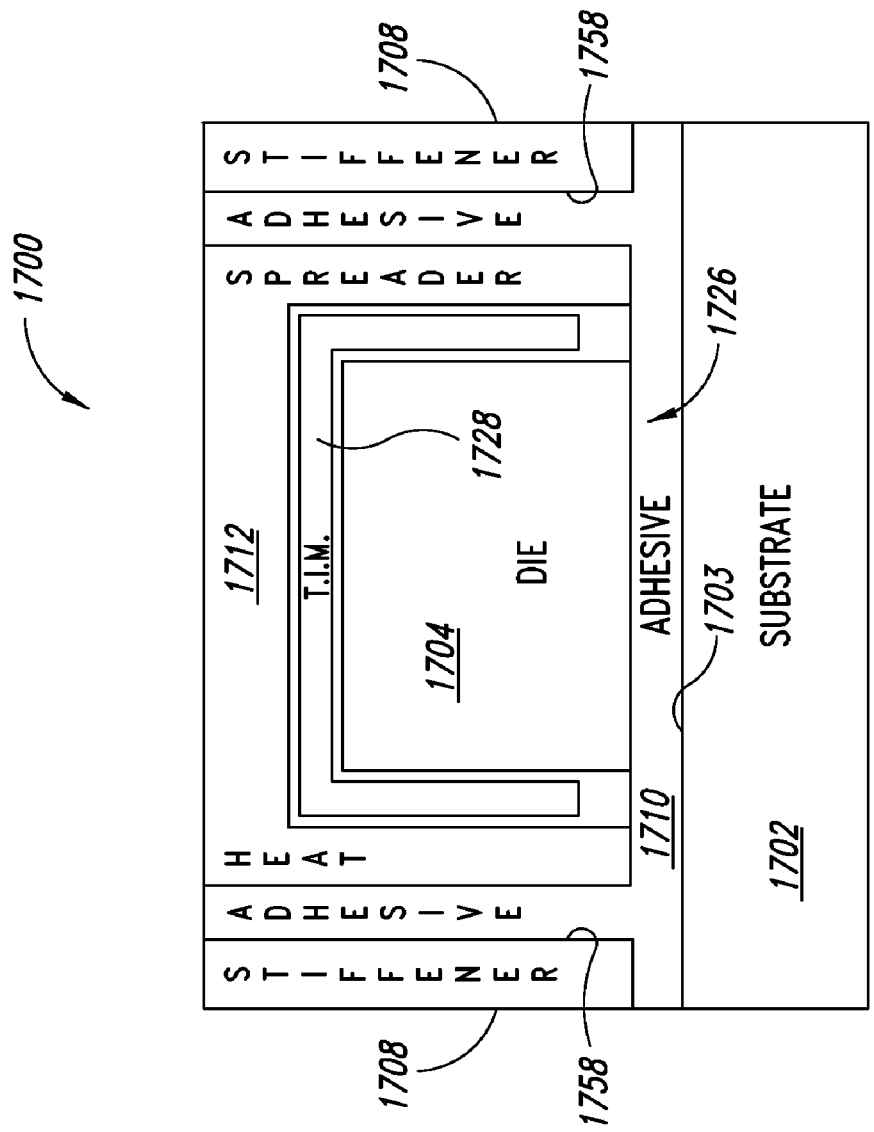
FIG. 17 illustrates an embodiment of a semiconductor package.

FIG. 17 is a side-cross sectional view of an embodiment of a semiconductor package 1700. The package 1700 comprises a substrate 1702 and a die 1704 coupled to the substrate 1702. As illustrated, the die 1704 is coupled to the substrate 1702 using an adhesive 1710. The die 1704 may be coupled to the substrate in other or additional ways. For example, solder bumps (see solder bumps 932 of FIG. 9) may couple the die 1704 to the substrate 1702 in addition to or instead of the adhesive 1710. The package 1700 comprises a stiffener 1708 and a heat spreader 1712, which as illustrated are coupled to each other and to the substrate 1702 using a continuous adhesive layer 1710. Some embodiments may employ multiple adhesive layers (see FIG. 9). A well 1726 is substantially defined by an inner surface 1758 of the stiffener 1708 and an inner surface 1703 of the substrate 1702. The heat spreader 1712 is positioned in the well 1726, and may have various shapes. See, for example, FIGS. 7, 8, 10, 11 and 13-15. A thermal interface 1728 is configured to thermally couple the die 1704 to the heat spreader 1712.

Conventionally, the resistance of a semiconductor package to warping and the reliability of the package are generally dependent on the thickness of the die and of the stiffener ring. Simulations of embodiments of the disclosure have shown that increasing the thickness of a lower portion of the heat spreader (see heat spreader 712 of FIG. 7) provides some rigidity to the package and increases the heat dissipation of the package, which can make the packages easier to assemble and improve quality, while decreasing the thickness of the die (see die 904 of FIG. 9) improves the solder joint reliability of the package in temperature cycle testing. These improvements can be obtained without increasing the overall thickness of the package. In addition, the process of assembling embodiments of the disclosed semiconductor package may follow the same flow as the process used to assemble conventional semiconductor packages. Thus, although different components will be used, the order of assembly of the components does not need to be modified.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package, comprising:
   a substrate having a first surface;
   a stiffener having a bottom and an inner surface, wherein the bottom of the stiffener is coupled to the first surface of the substrate and the inner surface of the stiffener and the first surface of the substrate are configured to form a well;
   a semiconductor die positioned in the well and coupled to the first surface of the substrate; and
   a heat spreader coupled to the stiffener and at least partially positioned in the well, the heat spreader including:
      a substantially slab-shaped top portion coupled to the stiffener;
      a substantially slab-shaped bottom portion extending from the top portion of the heat spreader into the well and having a perimeter smaller than a perimeter of the top portion of the heat spreader; and
      a rectilinear ring extending from the slab-shaped bottom portion of the heat spreader; and
   a thermal interface thermally coupling the die to the bottom portion of the heat spreader.

2. The semiconductor package of claim 1 wherein the stiffener comprises a rectilinear ring.

3. The semiconductor package of claim 1 wherein the rectilinear ring of the bottom portion of the heat spreader is coupled to the first surface of the substrate.

4. The semiconductor package of claim 1 wherein the die is thinner than the stiffener.

5. The semiconductor package of claim 1 wherein the heat spreader comprises a single piece of thermally conductive material.

6. The semiconductor package of claim 1 wherein the heat spreader comprises one or more metallic pieces.

7. The semiconductor package of claim 1 wherein the heat spreader comprises one or more ceramic pieces.

8. The semiconductor package of claim 1 wherein the heat spreader is formed from a plurality of pieces of thermally conductive material.

9. The semiconductor package of claim 8 wherein the plurality of pieces comprises a first piece formed from a first thermally conductive material and a second piece formed from a second thermally conductive material.

10. A semiconductor package, comprising:
    a substrate having a first surface;
    a stiffener having a bottom and an inner surface, wherein the bottom of the stiffener is coupled to the first surface of the substrate and the inner surface of the stiffener and the first surface of the substrate are configured to form a well;
    a semiconductor die positioned in the well and coupled to the first surface of the substrate; and
    a heat spreader coupled to the stiffener and at least partially positioned in the well, the heat spreader including:
       a substantially slab-shaped top portion coupled to the stiffener;
       a substantially slab-shaped bottom portion extending from the top portion of the heat spreader into the well and having a perimeter smaller than a perimeter of the top portion of the heat spreader; and a plurality of legs extending from the top portion of the heat spreader into the well, wherein the plurality of legs are coupled to the first surface of the substrate; and a thermal interface thermally coupling the die to the bottom portion of the heat spreader.

11. The semiconductor package of claim 10 wherein the die is thinner than the stiffener.

12. The semiconductor package of claim 10 wherein the heat spreader comprises a single piece of thermally conductive material.

13. The semiconductor package of claim 10 wherein the heat spreader includes a first piece formed from a first thermally conductive material and a second piece formed from a second thermally conductive material.

14. A semiconductor package, comprising:
a substrate having a first surface;
a rectilinear ring stiffener having a bottom and an inner surface, wherein the bottom of the stiffener is coupled to the first surface of the substrate and the inner surface of the stiffener and the first surface of the substrate are configured to form a well;
a semiconductor die positioned in the well and coupled to the first surface of the substrate; and
a heat spreader coupled to the stiffener and at least partially positioned in the well, the heat spreader including:
a substantially slab-shaped top portion;
a bottom portion extending from the top portion of the heat spreader and coupled to the inner surface of the stiffener; and
a thermal interface thermally coupling the die to the bottom portion of the heat spreader.

15. The semiconductor package of claim 14 wherein the die is thinner than the stiffener.

16. The semiconductor package of claim 14 wherein the heat spreader comprises a single piece of thermally conductive material.

17. The semiconductor package of claim 14 wherein the heat spreader includes a first piece formed from a first thermally conductive material and a second piece formed from a second thermally conductive material.

18. The semiconductor package of claim 14 wherein the bottom portion of the heat spreader includes a substantially slab-shaped region having a perimeter smaller than a perimeter of the top portion of the heat spreader.

19. The semiconductor package of claim 18 wherein the bottom portion of the heat spreader includes a rectilinear ring extending from the slab-shaped region of the bottom portion of the heat spreader.

20. The semiconductor package of claim 18 wherein the bottom portion of the heat spreader includes a plurality of legs extending from the slab-shaped region of the bottom portion of the heat spreader.

21. A system, comprising:
a semiconductor package, including:
a substrate having a first surface;
a rectilinear ring stiffener having a bottom and an inner surface, wherein the bottom of the stiffener is coupled to the first surface of the substrate and the inner surface of the stiffener and the first surface of the substrate are configured to form a well;
a semiconductor die positioned in the well and coupled to the first surface of the substrate;
a heat spreader coupled to the stiffener and at least partially positioned in the well, the heat spreader including:
a substantially slab-shaped top portion coupled to the stiffener;
a substantially slab-shaped bottom portion extending from the top portion of the heat spreader into the well and having a perimeter smaller than a perimeter of the top portion of the heat spreader; and
a rectilinear ring extending from the slab-shaped bottom portion of the heat spreader; and
a thermal interface thermally coupling the die to the bottom portion of the heat spreader; and
a circuit board communicatively coupled to the semiconductor package.

22. The system of claim 21 wherein the die is thinner than the stiffener.

23. The system of claim 21 wherein the heat spreader is formed from a plurality of pieces of thermally conductive material.

24. A system, comprising:
a semiconductor package, including:
a substrate having a first surface;
a rectilinear ring stiffener having a bottom and an inner surface, wherein the bottom of the stiffener is coupled to the first surface of the substrate and the inner surface of the stiffener and the first surface of the substrate are configured to form a well;
a semiconductor die positioned in the well and coupled to the first surface of the substrate;
a heat spreader coupled to the stiffener and at least partially positioned in the well, the heat spreader including:
a substantially slab-shaped top portion coupled to the stiffener;
a substantially slab-shaped bottom portion extending from the top portion of the heat spreader into the well and having a perimeter smaller than a perimeter of the top portion of the heat spreader; and
a rectilinear ring extending from the slab-shaped region of the bottom portion of the heat spreader; and
a thermal interface thermally coupling the die to the bottom portion of the heat spreader; and
a circuit board communicatively coupled to the semiconductor package, wherein the bottom portion of the heat spreader is coupled to the inner surface of the stiffener.

25. The system of claim 24 wherein the die is thinner than the stiffener.

26. The system of claim 24 wherein the heat spreader is formed from a plurality of pieces of thermally conductive material.

* * * * *